US007315482B2

United States Patent
Lin et al.

(10) Patent No.: US 7,315,482 B2
(45) Date of Patent: Jan. 1, 2008

(54) MEMORY DEVICE WITH A PLURALITY OF REFERENCE CELLS ON A BIT LINE

(75) Inventors: Ching Chung Lin, Taipei (TW); Nai Ping Kuo, Hsinchu (TW); Han Sung Chen, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 117 days.

(21) Appl. No.: 11/250,005

(22) Filed: Oct. 13, 2005

(65) Prior Publication Data

US 2007/0086255 A1    Apr. 19, 2007

(51) Int. Cl.
*G11C 7/02* (2006.01)

(52) U.S. Cl. .............. 365/210; 365/185.05; 365/185.2; 365/211

(58) Field of Classification Search ................ 365/210, 365/185.2, 185.05, 211
See application file for complete search history.

(56) References Cited

U.S. PATENT DOCUMENTS

| 5,463,586 | A | 10/1995 | Chao et al. |
| 6,219,290 | B1 | 4/2001 | Chang et al. |
| 6,392,447 | B2 | 5/2002 | Rai et al. |
| 6,421,275 | B1 | 7/2002 | Chen et al. |
| 6,449,190 | B1 | 9/2002 | Bill |
| 6,459,620 | B1 | 10/2002 | Eshel |
| 6,498,751 | B2 | 12/2002 | Ordonez et al. |
| 2003/0043621 | A1* | 3/2003 | Wong ................ 365/185.03 |
| 2004/0062072 | A1* | 4/2004 | Tanzawa ................ 365/145 |
| 2005/0286299 | A1* | 12/2005 | Tomita et al. ......... 365/185.11 |
| 2006/0044886 | A1* | 3/2006 | Iwata et al. ........... 365/189.09 |

* cited by examiner

*Primary Examiner*—Son Dinh
*Assistant Examiner*—Toan Le
(74) *Attorney, Agent, or Firm*—Haynes Beffel & Wolfeld LLP (57) ABSTRACT

In accordance with one embodiment of the invention, a memory device comprises an array of memory cells arranged into word lines and bit lines, with a sense amplifier and a plurality of reference cells for each bit line. The sense amplifier for a bit line compares the output of a memory cell for that bit line with the output of one of the plurality of reference cells for that bit line.

18 Claims, 9 Drawing Sheets

MEMORY DEVICE WITH A PLURALITY OF REFERENCE CELLS ON A BIT LINE

FIELD OF THE INVENTION

The present invention relates to memory devices, and in particular to a memory device with a plurality of reference cells on a bit line.

BACKGROUND OF THE INVENTION

Figure 1:
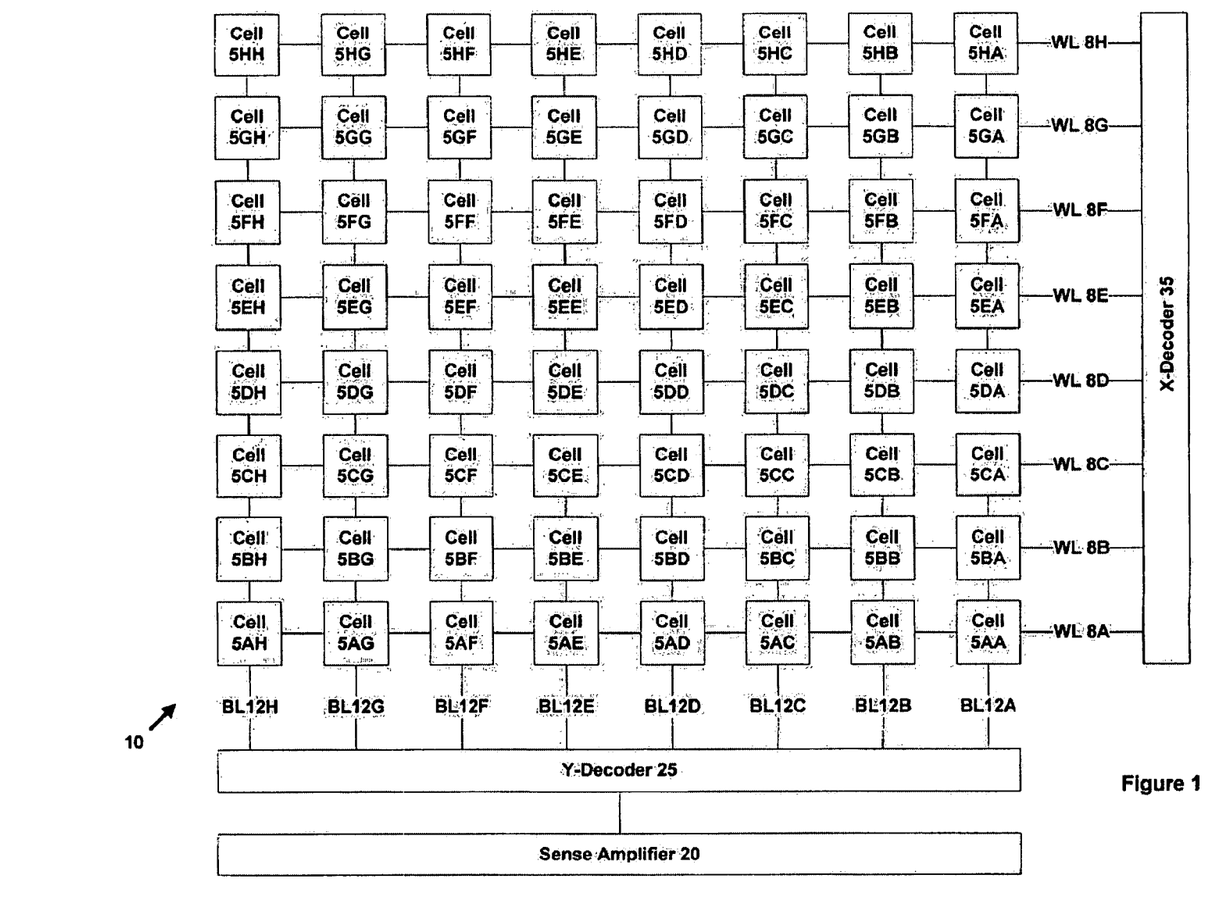
FIG. 1 is a schematic depiction of a memory device.

FIG. 1 is a schematic representation of a typical memory device 10. The memory device 10 comprises an array of cells 5AA, 5BB, 5BA, etc. Each cell is used to store one bit of data. Each row of cells in the array is linked by a word line 8A, 8B, etc, while each column of cells in the array is linked by a bit line, 12A, 12B, 12C, etc. Any given cell can therefore be uniquely specified by a combination of the appropriate word line 8 and bit line 12. For example, as shown in FIG. 1, cell 5EF can be accessed by the combination of word line 8E and bit line 12F. An X-decoder 35 (also referred to as a row decoder) is used to select a word line 8, while a Y-decoder 25 (also referred to as a column decoder) is used to select a bit line 12, both dependent upon the specified address of a memory operation.

The memory device 10 further includes a sense amplifier 20 connected to each bit line. The sense amplifier is used to read data from or write data to a desired memory cell 5 in accordance with the selected word line 8 and bit line 12. Note that although sense amplifier 20 is shown in FIG. 1 as a single block, it is usually implemented as a separate sense amplifier per bit line.

The memory device 10 of FIG. 1 comprises an 8×8 cell storage array, but it will be appreciated that most commercial memory devices incorporate a much larger number of cells. In addition, the number of rows of cells in the array will often be different from the number of columns. Note that some memory devices may comprise multiple cell storage arrays. One example of a known memory device is described in U.S. Pat. No. 5,463,586.

The implementation of an individual memory cell 5 within memory device 10 depends upon the particular type of memory device. Where memory device 10 represents non-volatile ROM (NVROM), such as flash memory, each cell 5 may comprise a floating gate which is used to control the threshold voltage of a cell transistor. The value stored in the cell depends upon the setting of the floating gate. If the floating gate is put into a charged or programmed state, this raises the threshold voltage. Alternatively, if the floating gate is returned to its unprogrammed state by an erasure process, this lowers the threshold voltage. (Note that some other types of non-volatile memory do not have a floating gate).

A non-volatile memory cell may be programmed or erased by applying appropriate voltages to the cell transistor. For example, in one type of flash memory, a cell may be programmed by applying a predetermined raised voltage to the gate and drain of the cell transistor, while in a read operation, a lower predetermined voltage is applied to the gate and drain of the cell transistor. The lower predetermined voltage is intermediate the threshold voltage for the programmed and non-programmed states. As a result, the programmed cells do not conduct (or conduct poorly), and so are taken as having binary value 0, while the non-programmed (and erased) cells conduct well, and so are taken as having binary value 1.

Flash memory devices are usually provided with one or more reference cells. For example, a flash memory may contain a read (RD) reference cell which is used in a comparison as part of the read operation to determine whether a given cell is programmed (binary value 0) or not programmed (binary value 1). The comparison may be implemented by sense amplifier 20 in the form of a comparator or differential amplifier, which is used to detect whether the current (or voltage) from the read reference cell is greater or less than the current (or voltage) from the storage cell on the word and bit line being read.

Figure 2:
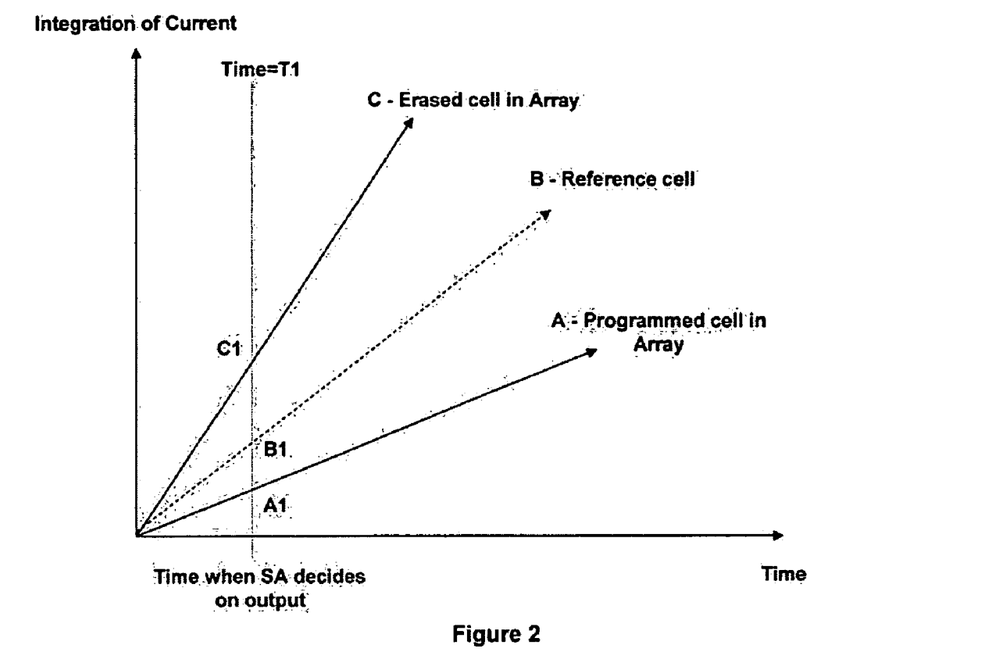
FIG. 2 is a schematic plot illustrating the use of a reference cell to discriminate between an erased cell and a programmed cell.

This situation is illustrated in FIG. 2, which shows a plot of integrated current through the sense amplifier against time. FIG. 2 shows three different lines, one labelled A representing a programmed cell, another labelled C representing an erased (or non-programmed) cell, and another labelled B representing the read reference cell. It will be seen that the output current for the read reference cell is intermediate the output currents for the programmed cell and the erased cell.

The discrimination between a programmed cell and an erased cell is made at time T=T1. In FIG. 2, the integrated current from the erased cell at time T1 is denoted C1, the integrated current from the reference cell at time T1 is denoted B1, and the integrated current from the programmed cell at time T1 is denoted A1, where C1>B1>A1. Accordingly, if a memory cell is read at time T1, it is regarded as programmed (i.e. a binary 0) if the integrated current is less than B1, and erased (i.e. a binary 1) if the integrated current is greater than B1.

Another example of a reference cell is an erase-verify (EV) reference cell, which is used during erase operations to confirm that each memory cell 5 has been successfully erased. In one implementation, following erasure, it is confirmed that the threshold voltage for each of the erased memory cells 5 is less than the threshold voltage for the EV reference cell. This ensures that the memory cells will henceforth conduct during a read operation, and therefore be taken as a storing a binary value 1—i.e. the memory cells have been properly erased. It will be appreciated that the EV reference cell may also be used for a comparison of current (such as shown in FIG. 2), rather than a direct comparison of threshold voltage.

Similarly, a program-verify (PV) reference cell may be utilised during program operations to confirm that each memory cell 5 has been successfully programmed. In particular, following programming, it is confirmed that the threshold voltage for each of the programmed memory cells 5 is greater than the threshold voltage for the PV cell. This ensures that the memory cells will henceforth not conduct during a read operation, and therefore be taken as storing a binary value 0—i.e. the memory cells have been properly programmed. Again, the PV reference cell may also be used for a comparison of current (such as shown in FIG. 2), rather than a direct comparison of threshold voltage.

Note that the threshold voltage of the read reference cell is normally greater than the threshold voltage of the erase-verify reference cell, and lower than the threshold voltage of the program-verify reference cell. Conversely, the current through a read reference cell is normally lower than the current through the erase-verify reference cell, and greater than the current through the program-verify reference cell.

An important consideration in designing flash memory is to set the appropriate threshold voltage for the read reference cell, the erase-verify reference cell, and the program verify reference cell. The settings of these reference cells must be able to accommodate manufacturing and other variations in the storage cells 5 of the device. It is sometimes possible during set-up of a device to adjust the threshold voltage of the storage cells 5 to conform to the reference cells, but this can be time-consuming. U.S. Pat. No. 6,449,190 describes a flash memory device in which the threshold voltages of the reference cells are adapted to match the storage cells of a given device.

U.S. Pat. No. 6,421,275 describes a method for adjusting a (read) reference current of a flash nitride ROM (NROM), which uses an oxide-nitride-oxide layer for charge storage (rather than a floating gate). In particular, the reference current is compared against an adjusting current in order to modify the reference current to an appropriate value.

U.S. Pat. No. 6,459,620 describes sense amplifier offset cancellation in non-volatile memory circuits by the use of dedicated programmed reference non-volatile memory cells. In particular, the comparison between a reference cell and a storage cell being read can be impacted by variations or offset in the comparator or sense amplifier for the bit line to which the storage cell being read is attached. Accordingly, a dedicated reference cell may be associated with each comparator. The dedicated reference cell can then be programmed to compensate for any internal offset within the comparator. This is achieved by examining the output from the comparator based on providing the reference cell output to the comparator in conjunction with a programmed predetermined threshold voltage.

Nevertheless, existing approaches do not fully accommodate all variations within a flash memory when setting reference cell levels.

SUMMARY OF THE INVENTION

One embodiment of the invention provides a memory device comprising an array of memory cells arranged into word lines and bit lines, a sense amplifier for each bit line, and a plurality of reference cells for each bit line. The sense amplifier for a bit line compares the output of a memory cell for that bit line with the output of a reference cell for that bit line.

The provision of reference cells for each bit line enables the reference cells to be programmed to allow for variations from one bit line to another, in particular as regards any bias in the sense amplifier for that bit line, and also for intrinsic variations in memory cell properties from one bit line to another.

The memory device may comprise flash memory or other types of memory. In one particular embodiment the memory device comprises a nitride read only memory (NROM) device, although other embodiments may involve other types of flash memory.

In one particular embodiment, the reference cells for each bit line comprise a read reference cell, an erase-verify reference cell, and a program-verify reference cell. A control mechanism is provided for selecting which reference cell is to be used for any given sense operation by the sense amplifier. Thus the read reference cell is used for a read operation, the erase-verify reference cell is used to confirm an erase operation, and the program-verify reference cell is used to confirm a program operation.

One of the reference cells on a bit line may have a positive temperature coefficient for cell current, while another reference cell on the bit line may have a negative temperature coefficient for cell current. (Note that an erase-verify reference cell and a program-verify reference cell for a nitride read only memory generally exhibit such behaviour). It will be appreciated that if only a single reference cell is provided per bit line, for example using voltage offsets to provide a range of reference levels, then it is not possible to reproduce this diverse temperature dependence.

Another embodiment of the invention provides a method for manufacturing a memory device comprising an array of memory cells arranged into word lines and bit lines. The method involves providing at least one reference cell for each bit line, and programming a reference cell on a bit line in relation to the memory cells on that bit line.

Providing a reference cell for each bit line allows the reference cell to be programmed to accommodate the properties of its corresponding bit line. More particularly, the reference cell can be programmed in relation to the memory cells on the relevant bit line, thereby allowing for variability in memory cells from one bit line to another.

In one embodiment, the programming involves comparing the output of the reference cell with the output of each memory cell on the bit line, for example by using a sense amplifier provided for each bit line. It is then determined whether the output of each memory cell on the bit line has a desired relationship with the output of the reference cell, and a program pulse is provided to the reference cell if the output of any memory cell on the bit line does not have the desired relationship with the output of the reference cell. These operations can then be repeated until the output of each memory cell on the bit line has the desired relationship with the output of the reference cell-N.B. the level of program pulse may be increased in between at least some of the repetitions. In this manner, the reference cell is programmed to accommodate the variability of memory cells and sense amplifier on the specific bit line.

In one embodiment, the comparing involves supplying an internal voltage to the reference cell, and an external voltage to the memory cells on the bit line. The external voltage differs from the internal voltage by a predetermined margin. For example, in one embodiment, the reference cell comprises a read reference cell, and the predetermined margin corresponds to a cycle margin plus an erase margin.

In one embodiment, a plurality of reference cells are provided for each bit line. For example, each bit line may be provided with a read reference cell, an erase-verify reference cell, and a program-verify reference cell. After a first reference cell has been programmed for a bit line in relation to the memory cells on that bit line, the first reference cell may then be used as a reference point to program the other reference cells on the bit line (rather than programming the other reference cells directly in relation to the memory cells on the bit line). In one particular implementation, the other reference cells on the bit line are programmed by providing a one-time program (OTP) cell for each bit line, determining the value of an external voltage supply to the OTP cell that matches the first reference cell, and then programming the other reference cells on the bit line to match the OTP cell, subject to a predetermined margin.

Another embodiment of the invention involves operating a memory device comprising an array of memory cells arranged into word lines and bit lines. The method involves providing at least one of a program-verify or erase-verify reference cell for each bit line, and performing a program or erase operation on the array of memory cells. The method further involves using the program-verify or erase-verify reference cell for a bit line to confirm the success of the program or erase operation in respect of the memory cells for that bit line.

BRIEF DESCRIPTION OF THE DRAWINGS

One or more embodiments of the invention will now be described in detail by way of example only with reference to the following drawings.

DETAILED DESCRIPTION

Figure 3:
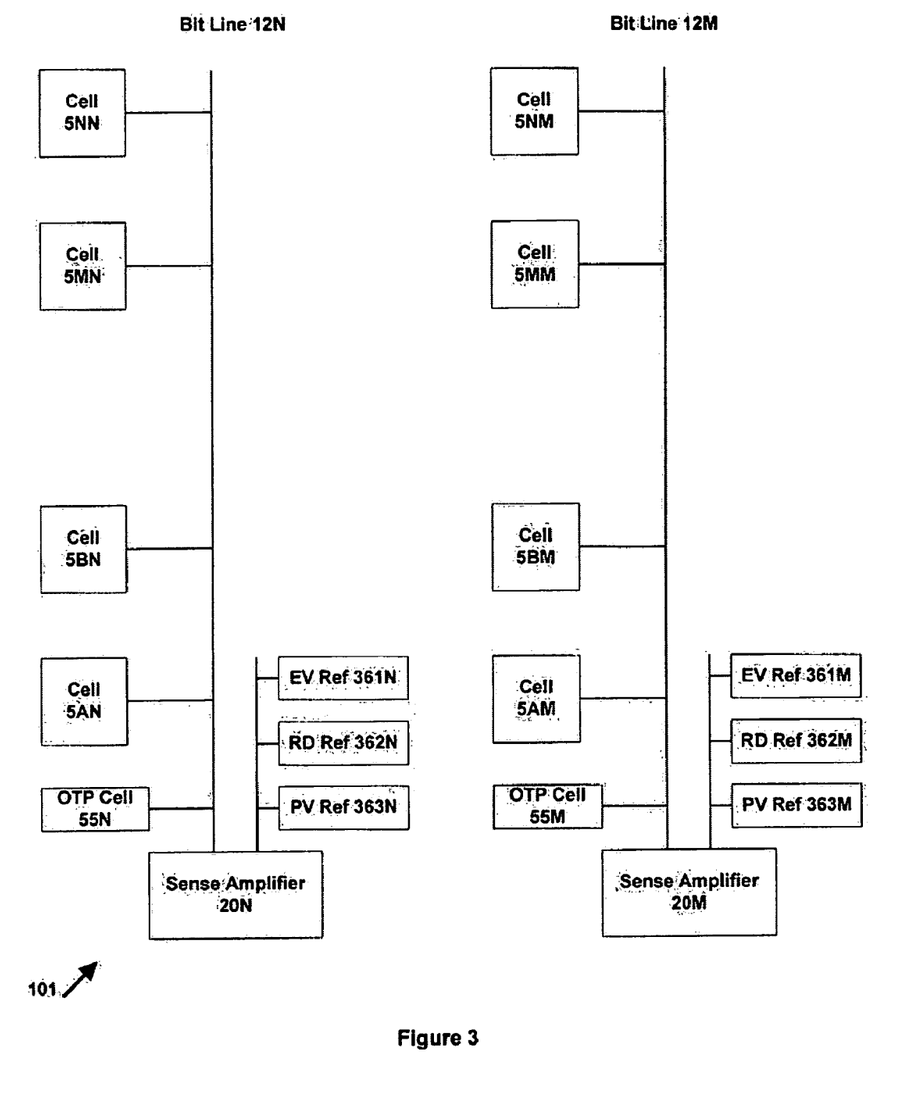
FIG. 3 is a schematic diagram of a memory device in accordance with one embodiment of the invention.

FIG. 3 illustrates a memory device 101 in accordance with one embodiment of the invention. Memory device 101 may be a flash nitride read only memory (NROM) or any other suitable form of memory device. For ease of representation, FIG. 3 shows only two bit lines 12N, 12M from device 101, although it will be appreciated that in practice device 101 is likely to have many more bit lines. In addition, FIG. 3 shows only four memory cells 5 per bit line, although again it will be appreciated that in practice device 101 is likely to have many more cells per bit line. In one embodiment, each bit line also has a corresponding one-time program (OTP) cell 55N, 55M, which is discussed in more detail below.

Each bit line 12N, 12M in device 101 is provided with its own sense amplifier 20N, 20M, and also with its own set of reference cells. In particular, associated with bit line 12M are erase-verify reference cell 361M, read reference cell 362M, and program-verify cell 363M. Likewise, associated with bit line 12N are erase-verify reference cell 361N, read reference cell 362N, and program-verify cell 363N. Device 101 is further provided with a suitable control facility (not shown in FIG. 3) for selecting the appropriate reference cell (EV, RD or PV) so that sense amplifier 20 compares the output from an array cell 5 with the desired reference cell. For example, in performing an erase-verify operation on bit line 12N, sense amplifier compares the output from cell 5AN, 5BN, etc with the output from EV reference cell 361N, while in performing a program-verify operation on bit line 12N, sense amplifier compares the output from cell 5AN, 5BN, etc with the output from PV reference cell 363N.

One advantage of having three separate reference cells 361, 362, 363 per bit line (rather than using offsets from a single reference cell) is that for an NROM, the output current has a positive temperature coefficient for a programmed cell and a negative temperature coefficient for an erased cell. Accordingly, if only a single reference cell were provided for each bit line, then there is the risk of margin loss with temperature changes, due to a difference in temperature coefficient between the reference cell and the array cells.

The provision of reference cells for each individual bit line also addresses potential variation in the sense amplifiers 20 and memory cells 5 on the different bit lines 12M, 12N. In particular, rather than switching when a memory cell being accessed and a selected reference cell are exactly equal, a sense amplifier may instead switch at some (non-zero) current offset ($I_{offset}$), where $I_{offset}$ is small yet variable from one sense amplifier to another. Consequently, if a single reference cell having current output $I_{rcell}$ is shared across all bit lines, then the array cells are in effect being compared against $I_{rcell}+I_{offset}$ (rather than $I_{rcell}$ alone). This in turn will introduce some variation from one bit line to another, reflecting the variation in $I_{offset}$ across the different sense amplifiers. However, having a separate reference cell for each bit line (rather than shared across all bit lines) allows a reference cell to be programmed so as to accommodate any offset in the sense amplifier for that bit line.

Figure 4:
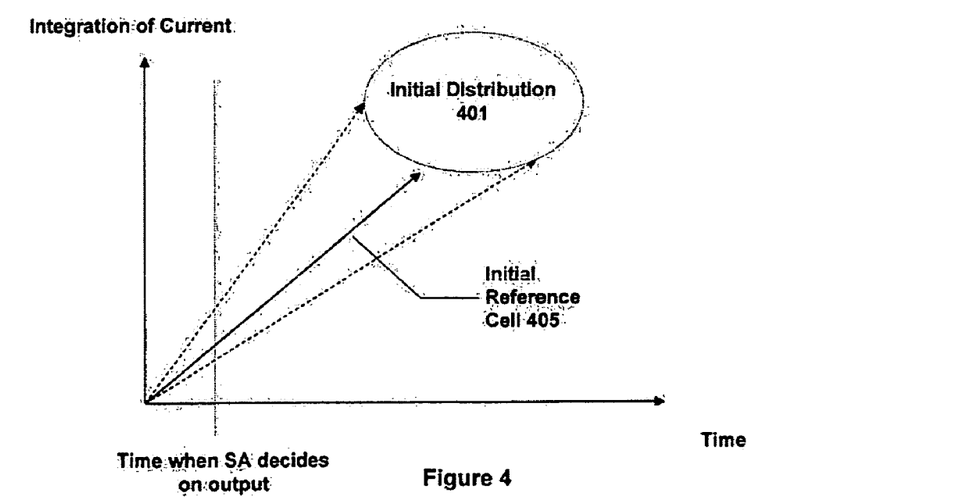
FIG. 4 is a schematic plot illustrating variability in the initial values of reference cells.

The outputs from the reference cells in memory device 101 are therefore configured to reflect both the properties of the individual memory cells 5 attached to the same bit line 12 as a given reference cell, as well as any offset in the sense amplifier 20 on that bit line. Note that the reference cells themselves are subject to intrinsic variation, as shown in the plot of FIG. 4, which depicts cell output with time in an analogous manner to the plot of FIG. 2. In particular, FIG. 4 illustrates the initial output properties of an individual reference cell 405, which can be considered as part of the population of reference cells on the memory device 101. The initial distribution of reference cells on device 101 is assumed to lie within region 401 of FIG. 4. Hence, the initial setting of any given reference cell is not known with precision prior to calibration and configuration.

Figure 5:
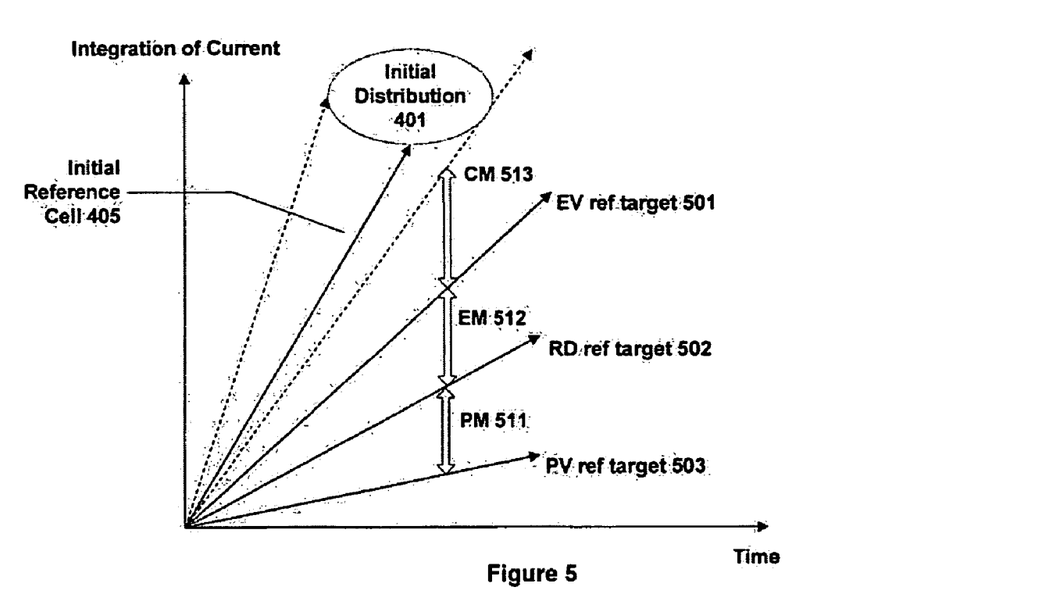
FIG. 5 is a schematic plot illustrating target positions for the various reference cells in accordance with one embodiment of the invention.

FIG. 5 illustrates the initial distribution of reference cells along with three target positions for a reference cell, corresponding to the three different types of reference cell, namely target position 501 for an erase-verify reference cell, target position 502 for a read reference cell, and target position 503 for a program-verify reference cell. In operation, any erased cell should produce a greater output current than erase-verify reference cell target 503, while any programmed cell should produce an output current less than the program-verify reference cell target 503. The difference between the read reference cell target 502 and the erase-verify target 501 therefore represents the erase margin 512, while the difference between the read reference cell target 502 and the program-verify target 503 represents the program margin 511. The provision of suitable margins 511, 512 ensures that there is a reliable discrimination between erased cells (binary 1) and programmed cells (binary 0). Also shown in FIG. 5 is cycle margin 513. This is provided to ensure that a cell does not become over-erased. (If too many electrons are removed from the floating gate during erasure, this may leave a slight positive charge, which can result in a leakage current).

Figure 6:
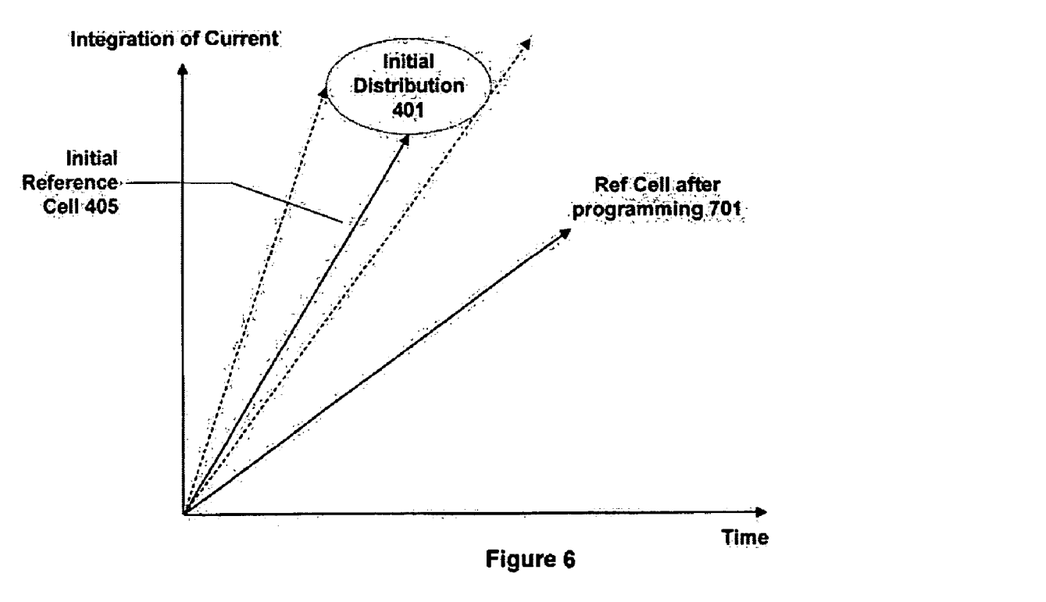
FIG. 6 is a schematic plot illustrating the programming of a reference cell in accordance with one embodiment of the invention.

During the configuration of device 101, the three reference cells for each bit line 12 are moved from their initial state, within distribution 401, and set to their relevant target positions 501, 502, 503. In particular, a reference cell is moved during programming from its initial position 405 to a desired position 701 (matching the relevant target position of FIG. 5). This calibration is illustrated in FIG. 6, which shows the output of a reference cell initially prior to programming 405, and subsequently after programming 701.

Figure 7:
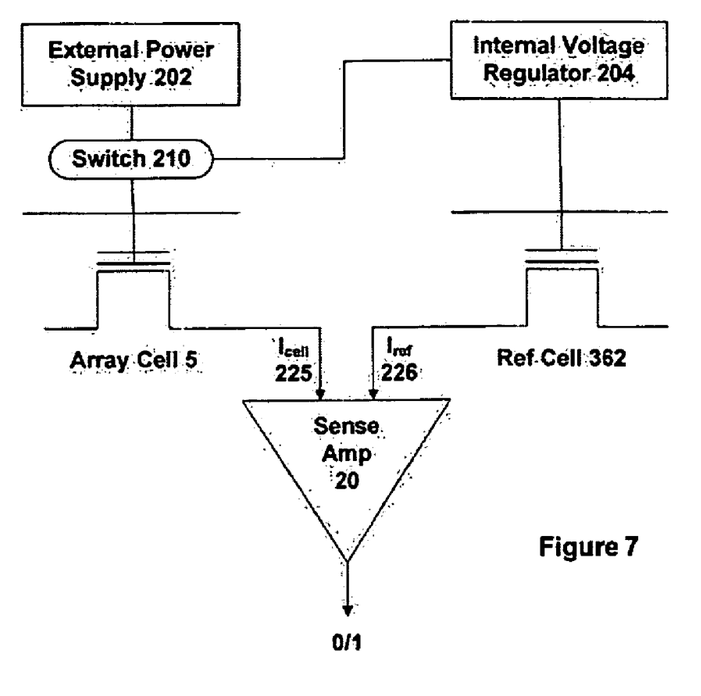
FIG. 7 is a schematic diagram illustrating apparatus for the calibration of a reference cell in accordance with one embodiment of the invention.

FIG. 7 is a schematic diagram illustrating apparatus for programming a reference cell 362 in accordance with one embodiment of the invention. The reference cell 362 produces an output current $I_{ref}$ 226, which is passed to sense amplifier 20. The sense amplifier 20 also receives an output current $I_{cell}$ 225 from an array cell 5. The output of the sense amplifier is then a binary 0 or 1 depending upon whether or not $I_{cell}$ 225 is greater than $I_{ref}$ 226. Note that although FIG. 7 illustrates only a single array cell 5, reference cell 362 can be paired with any array cell on the relevant bit line, dependent upon the word line that has been asserted to select the array cell.

The reference cell 362 is connected to an internal voltage regulator 204, which is part of the memory device 101, and which is used during normal memory operations. The array cell 5 is also connected to the internal voltage regulator 204 via switch 210. During normal operations of the memory device, switch 210 is set so that the voltage on the word line of the chosen array cell 5 is set by internal voltage regulator 204, in the same way as for reference cell 362. However, switch 210 also allows an external power supply 202 to be connected to the memory device 101. External power supply 202 is used during manufacture and testing of the memory device 101, and in particular is able to provide a voltage of any desired level to the word line of array cell 5.

Figure 8:
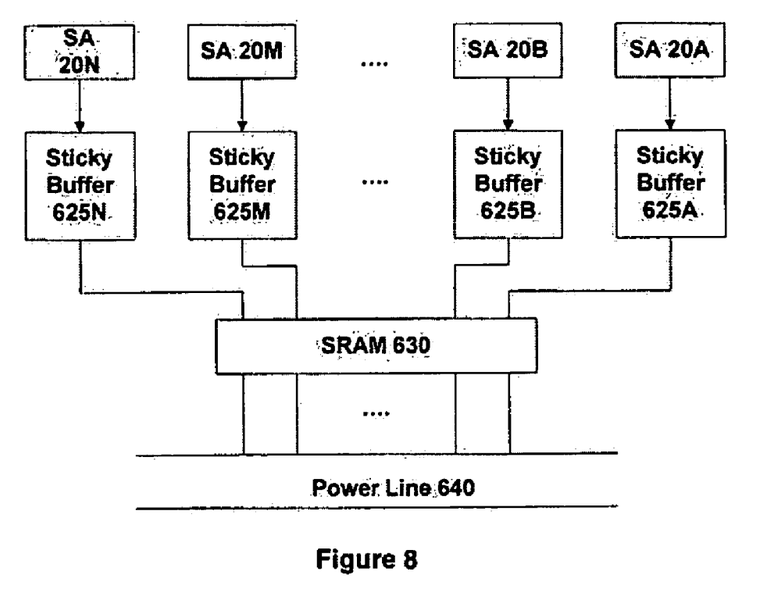
FIG. 8 is a schematic diagram illustrating apparatus for collecting calibration results for reference cells in different bit lines in parallel in accordance with one embodiment of the invention.

FIG. 8 is a schematic diagram illustrating how the results from the sense amplifier 20 of FIG. 7 may be collated and used to control the programming of reference cell 362. Thus FIG. 8 depicts multiple sense amplifiers 20A, 20B, etc. associated with the bits lines in the array. Each array cell 215 within a bit line is tested in turn to produce a corresponding sequence of bits, one per array cell, as the output from the sense amplifier for that bit line. The outputs from the sense amplifiers 620A, 620B are fed through respective sticky buffers 625A, 625B etc.

Each bit in the sequence represents the comparison result for a respective array cell. The bits in the sequence should all have the same value (say zero), provided that all the array cells 5 in the bit line have the same desired relationship to the reference cell 362—e.g. if the array cells 5 are programmed, then $I_{cell}$ 225 should be less than $I_{ref}$ 226. However, if any cell in the bit line fails this test, then the sequence of bits will contain the opposite value (say one) at the bit position in the sequence corresponding to the location of the cell that failed. The presence of a one in the bit sequence therefore indicates that further programming of reference cell 362 is needed to ensure that the reference cell conforms with the properties of the array cells 5 and the sense amplifier 20 for the bit line in question. However, the actual position of the one in the bit sequence (and hence the identity of the particular array cell for which the comparison failed) is not significant, since this procedure is being used to adjust the reference cell, not the individual array cells.

Sticky buffers 625A, 625B, etc are therefore used to flag the presence of a one in the output sequence from sense amplifiers 20A, 20B, etc. In other words, if a bit sequence that passes through a sticky buffer 625 is all zeros, then the output of the sticky buffer is also zero. However, if the bit sequence contains at least one one, then the output of the sticky buffer 625 is one. The output of a sticky buffer 625A, 625B indicates whether the reference cell for that particular bit line (i.e. the bit line containing the sticky buffer 625) needs additional programming, or whether it already has the desired relationship to all the array cells 5 in the bit line.

The configuration of FIG. 8 therefore allows the reference cells for the different bits lines to be investigated in parallel. The outputs from the sticky buffers 625A, 625B, etc for all the different bit lines are collected and stored into SRAM 630. The information in SRAM 630 can then be used to indicate those bit lines for which the corresponding reference cells need further programming to set them at an appropriate level. This further programming is controlled via power line 640.

Figure 9:
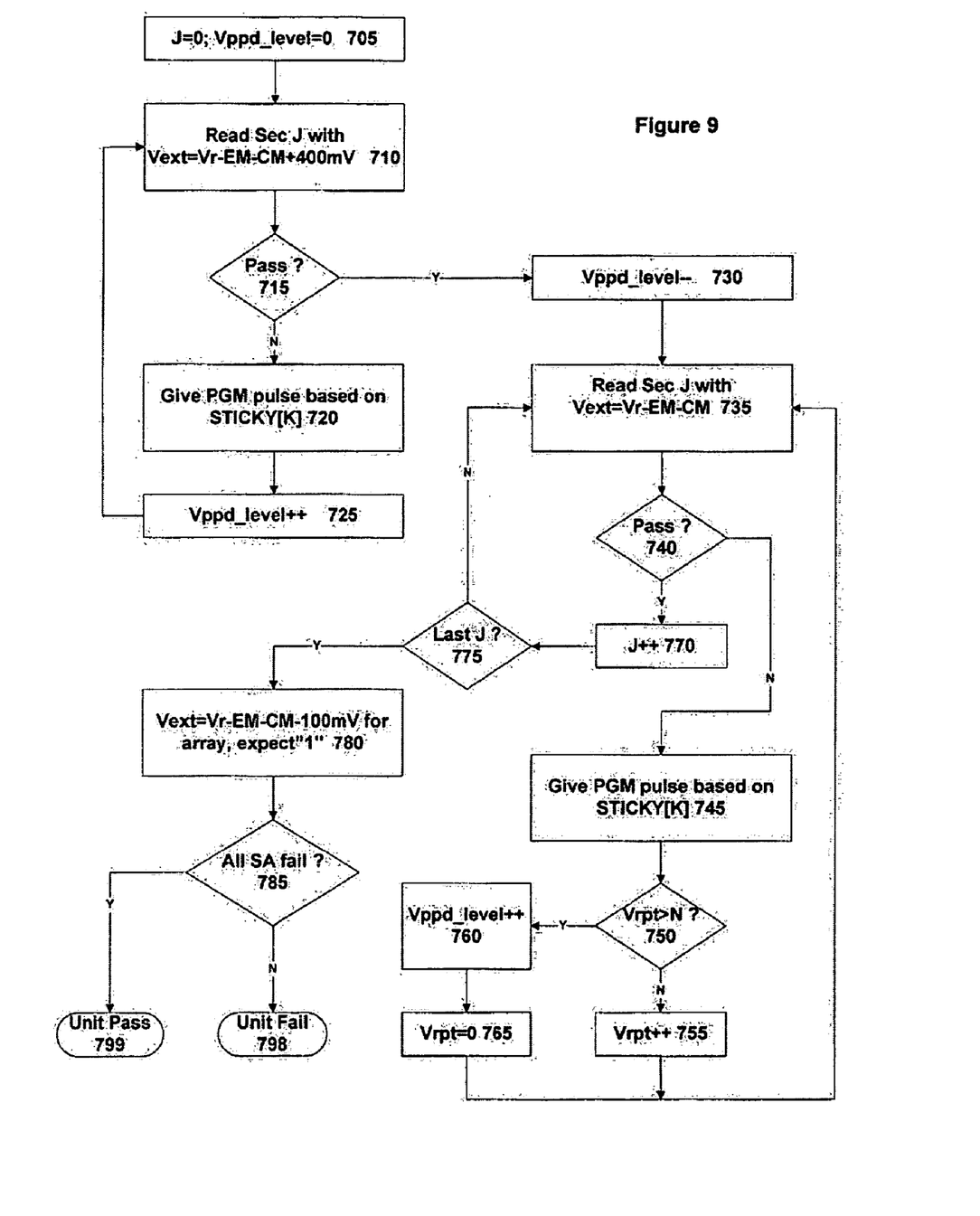
FIG. 9 is a flowchart illustrating a method for calibrating the reference cells in accordance with one embodiment of the invention.

FIG. 9 is a flowchart for programming the reference cells 362 in accordance with one embodiment of the invention. Note that in the particular embodiment described, the method is used to program the read reference cells 362, but an analogous technique could also be used to program the erase-verify and program-verify reference cells.

In the flowchart of FIG. 9, J denotes the sector number of the array cells being tested (every bit line within a given sector is tested in parallel), and Vppd_level represents the voltage level of a programming pulse applied to a reference cell. Such a programming pulse will tend to raise the threshold voltage of the reference cell—the greater the programming pulse employed, the more the threshold voltage is increased.

The flowchart of FIG. 9 commences with an initial phase, which only involves sector 0. This initial phase helps to set an appropriate level for Vppd_level, thereby avoiding the risk of a reference cell being over-programmed. Thus Vppd_level is initially set to zero or some other suitable starting value (705). The memory cells in sector J are then read using an external voltage, Vext, from the external voltage supply 202. Vext is less than the normal read voltage, Vr, as supplied by internal voltage regulator 204) to reference cell 362, by the amount EM+CM−400 mV (710). It will be appreciated that reducing the voltage supplied to the array cells 5 reduces the output current from these cells. Thus with reference to FIG. 5, this pulls the cells in the initial distribution 401 down towards the RD reference cell target 502.

Assuming that the reference cell 362 itself starts off in the initial distribution 401, then reducing the read voltage to the array cells 5 (but not to the reference cell 362) results in a lower output current from the array cells 5 than from the reference cell 362. This is sensed by the sense amplifier 20 for the relevant bits lines, and recorded in the sticky buffer 625. Such an outcome is regarded as a fail in the current context, so when the contents of the SRAM 630 are investigated (715), the result is that a program pulse is given to those reference cells 362 associated with the bit lines that did not pass (720). This program pulse increases the voltage threshold of the reference cell, and hence moves the reference cell from the initial distribution 401 towards the RD reference target 502 (see FIG. 5).

The program pulse level (Vppd_level) is now increased (725), and we loop back again to operation 710, where the array cells in sector 0 are again read with an externally supplied voltage of Vr−EM−CM+400 mV. The processing then iterates through the loop just described, applying a stronger program pulse to the read reference cells that fail in order to further reduce their threshold voltages.

At some stage during this loop, the read reference cells 362 will be located far enough towards the read reference target 502 that the array cells at the top end of the initial distribution 401 (i.e. having a relatively low threshold voltage) produce a larger output current than the corresponding reference cells, despite the lower voltage applied to the array cells. The reference cells can therefore be considered as having passed with respect to these array cells. However, as long as there are at least some array cells associated with a given read reference cell that do not pass (which will be the array cells that initially have the highest threshold voltage), then this is recorded as a failure in the corresponding sticky buffer 625, and the relevant reference cell is given a program pulse at operation 720.

Once a reference cell 362 has been sufficiently programmed such that its output current is less than the output current for all of the array cells for the corresponding bit line, then that reference cell 362 is recorded in sticky buffer 625 as having passed. Accordingly, such a reference cell 362 does not receive any further program pulse at operation 720; in other words, the threshold voltage of this reference cell is not further increased. It will be appreciated that this approach therefore allows each reference cell to be programmed to a level that it appropriate for the particular bit line on which the reference cell is located, having in mind the properties of the individual array cells and the sense amplifier associated with that bit line.

When all the reference cells in sector 0 have been suitably programmed, operation 715 yields a positive result, and the first phase is complete. Note that the first phase of the reference cell programming is based on a total margin of EM+CM−400 mV, in other words 400 mV short of the full desired margin of EM+CM between the initial distribution 401 and the desired read reference target 502 (see FIG. 5). The first phase can be considered as relatively coarse, in that Vppd_level is increased each iteration, and allows an approximate suitable value for Vppd_level to determined. In the second phase a somewhat finer programming is performed, in that Vppd_level is increased more gradually. The transition from the first phase to the second phase therefore results in a decrease in the rate of programming the reference cell once we have approached within 400 mV of the (ultimately) desired margin. This reduces the risk of overshooting the desired read reference target 502 (i.e. the risk of over-programming the read reference cell).

The second phase commences with decrementing Vppd_level (730) (note however that we do not have to go all the way back to the initial value of Vppd_level, as per operation 705). For each sector of the memory device, we now perform an analogous test as for operation 710, in that each memory cell in the array is read out and compared with the corresponding reference cell (735). However, operation 735 now uses the full desired margin (EM+CM)—in other words, the voltage supplied to the word line from the external power source 202 is less than the voltage supplied to the read reference cell 362 by EM+CM (rather than EM+CM−400 mV, as for operation 710). A test is now made to see if all the array cells have passed (740), and if not a program pulse is given to those reference cells that did not pass (745).

In the first phase Vppd_level was incremented for each iteration (operation 725). In the second iteration however Vppd_level is only incremented every N iterations, thereby providing a more gradual (less aggressive) programming of the reference cell. In particular, a counter Vrpt is provided, and this counter is tested against a threshold of N (750). If the threshold is not exceeded, Vrpt is incremented (but not Vppd_level), and we return to the beginning of the loop (operation 735). Alternatively, once the threshold of N has been exceeded, then Vppd_level is now incremented (760), the counter Vrpt is reset to zero (765), and we again return to the beginning of the loop (operation 735).

Once all the reference cells in one sector have passed, we move onto the next sector (770), and repeat the second phase of programming the reference cells, until all the sectors have been processed (775). This leads to a third and final phase of the programming, in which the whole array is read (780), this time with the voltage supplied to the word line from the external power source 202 being less than the voltage supplied to the read reference cell 362 by EM+CM+100 mV (rather than EM+CM, as for operation 735).

This further reduction in the voltage supplied to the array cells again reduces the current output from the array cells, in effect pulling at least some of the initial distribution 401 of FIG. 5 down past the read reference target 502. Accordingly, it is expected that for each bit line in the array, at least some of the cells associated with that bit line will fail, in other words, the cell will produce an output current less than the output current from the read reference cell. If every bit line—i.e. every sense amplifier, is found to fail (785), then overall the memory device 10 is considered to have passed (799). Alternatively, if some bit lines have not failed, this implies that their corresponding read reference cells have more margin than desired (i.e. they have been over-programmed), and hence the memory device is considered to have failed (798).

The method of FIG. 9 allows the read reference cells 362 in the array to be programmed to a suitable level that is dependent upon the bit line 12 in which the read reference cell is located. In one embodiment, a similar strategy is used to program the erase-verify reference cells 361 and the program-verify reference cells 363 (except that the margin used in the read test of operation 735 is adjusted accordingly).

In an alternative embodiment, a slightly different approach is used, in which the erase-verify reference cells 361 and the program-verify reference cells 363 are in effect calibrated off the read reference cells 362. In this embodiment, a one-time program cell (OTP) 55M, 55N is provided for each bit line (see FIG. 3). The OTP cells can be accessed via a word line to produce an output on the corresponding bit line 12, which then arrives at the sense amplifier 20 for comparison with the selected reference cell in the same manner as for the other memory cells 5 of the array. (It will be appreciated that these OTP cells may be omitted from memory device 101 in embodiments where a different approach is used for calibrating the program-verify and erase-verify reference cells).

A two-phase procedure is used to program the erase-verify cells 361 and the program-verify cells 363. In a first phase, the (programmed) read reference cell 362 is connected to the internal voltage regulator 204, while the OTP cell 55 is connected to the external power supply 202. (This is analogous to the configuration of FIG. 7, with OTP cell 55 taking the place of array cell 5). The external voltage is now modified to a value $V_{OTP(RD)}$ at which the output of the OTP cell matches the output of the read reference cell. In particular, the value of $V_{OTP(RD)}$ can be determined by repeatedly accessing the OTP cell 55 with a series of (say) decreasing voltages from the external power supply 202. $V_{OTP(RD)}$ then represents the voltage at the point in the series at which the sense amplifier output transitions from 1 to 0.

Figure 10A:
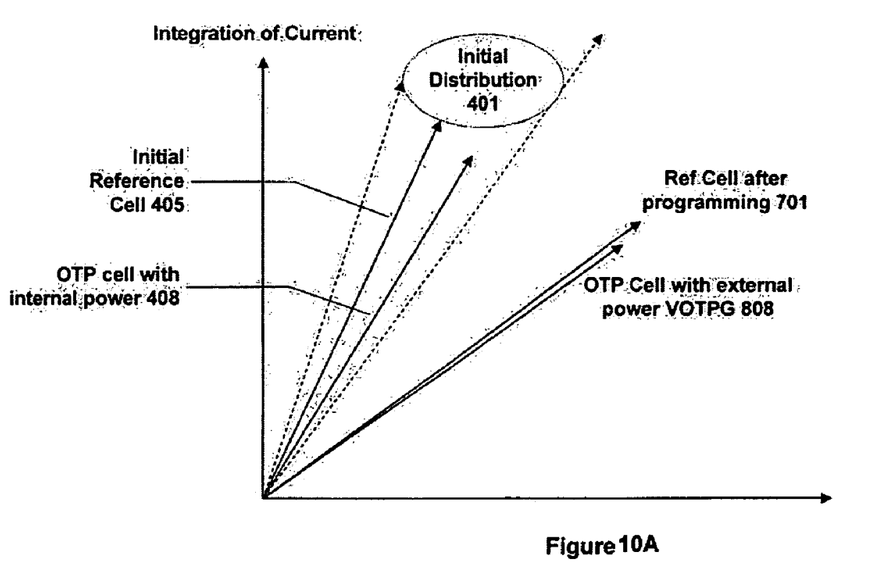
FIGS. 10A, 10B, and 10C illustrate the use of a one-time program (OTP) cell for calibrating reference cells in accordance with one embodiment of the invention.

This first phase is illustrated schematically in FIG. 10A. The OTP cell 55 lies initially within distribution 401, and hence its (typical) output with an applied external voltage equal to the voltage from internal regulator 204 is represented by arrow 408. The voltage from external power supply 202 to the OTP cell 55 is then reduced from the value corresponding to the internal regulator, thereby causing the output current from the OTP cell to drop. At some point, the output current from the OTP cell falls beneath the output current from the programmed read reference 701 (which is supplied by the internal regulator). This transition can be detected since the sense amplifier 20 now produces a 0 rather than a 1. At this point the external voltage applied to the OTP cell 55 corresponds to $V_{OTP(RD)}$, and the output from the OTP cell 55 is represented by arrow 808 in FIG. 10A.

Figure 11:
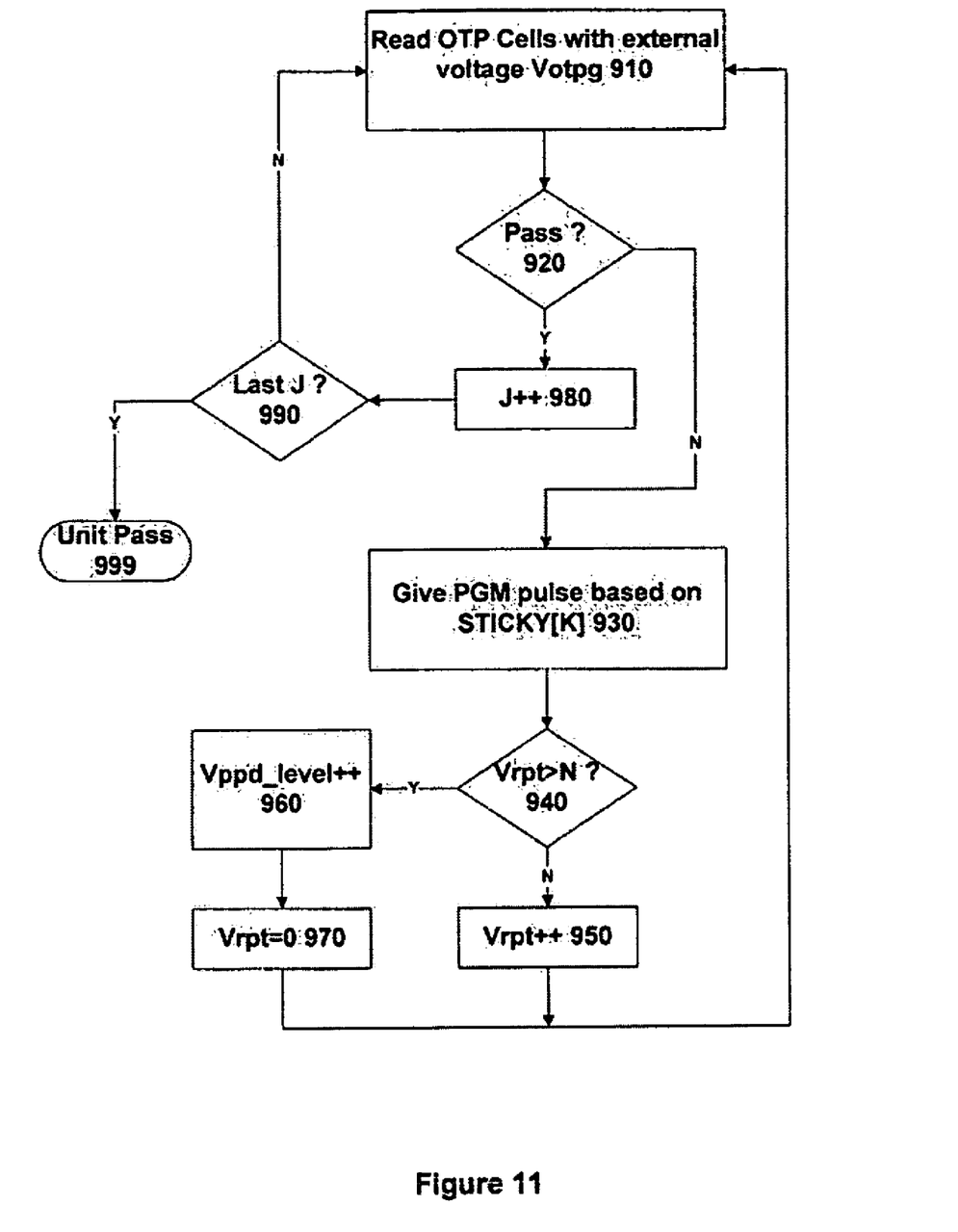
FIG. 11 is a flowchart depicting a method for using an OTP cell for calibrating reference cells in accordance with one embodiment of the invention.

Once the value of $V_{OTP(RD)}$ has been determined, the second phase is started, in which the program-verify 363 and erase-verify cells 361 are programmed. The procedure for this second phase is illustrated by the flowchart of FIG. 11, and is generally similar to the procedure for programming the read reference cells (as show in FIG. 9), except that the OTP cells 55 are used for comparison rather than the array cells 5.

Thus the procedure starts with reading the OTP cells against the selected reference cells (erase-verify or program-verify) (910). The reference cells are supplied from the internal voltage regulator 204, while the OTP cells are supplied from the external power supply 202 with a voltage based on $V_{OTP(RD)}$, but adjusted to provide the desired margin (i.e. EM 512 for an erase-verify cell 361, or PM 511 for a program-verify cell 363—see FIG. 5). The outputs from these read operations are passed as before through sticky buffer 625 (although this time there is only one output per bit line), and then stored into SRAM 630 where they are tested (920).

Since the reference cells start in the initial distribution 401 with low threshold voltage, it is expected that the sense amplifiers will initially output 0, which corresponds to a fail within the context of operation 920. Accordingly, all reference cells that failed at operation 920 are given a program pulse of level Vppd_level (930), with SRAM 630 being used as before to determine those bit lines on which the reference cells failed and which are therefore to receive a program pulse.

A determination is now made as to whether or not to increment Vppd_level. In particular, a program pulse of any given value of Vppd_level is applied N times before incrementing Vppd_level. A counter Vrpt is used to record the number of times a given Vppd_level has been applied. Thus a test is made to see whether Vrpt has reached N (940); if not Vrpt is incremented (950), with Vppd_level being left unchanged. However, if Vrpt is found to exceed N, then Vppd_level is incremented to its next level (960), and Vrpt is reset to zero (970). In either case, we then loop back up to operation 910, and perform another read test.

Figure 10B:
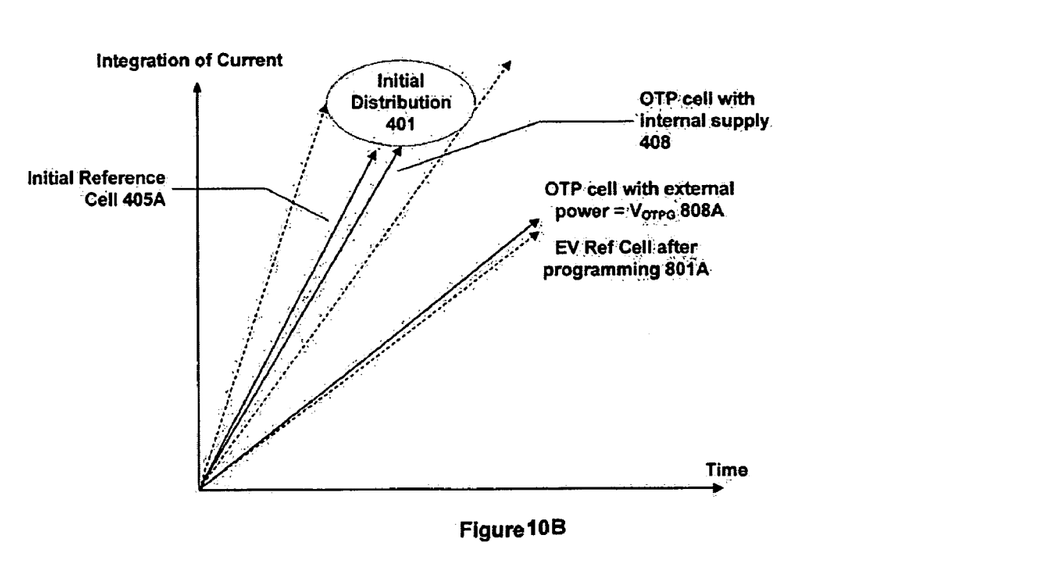
Figure 10C:
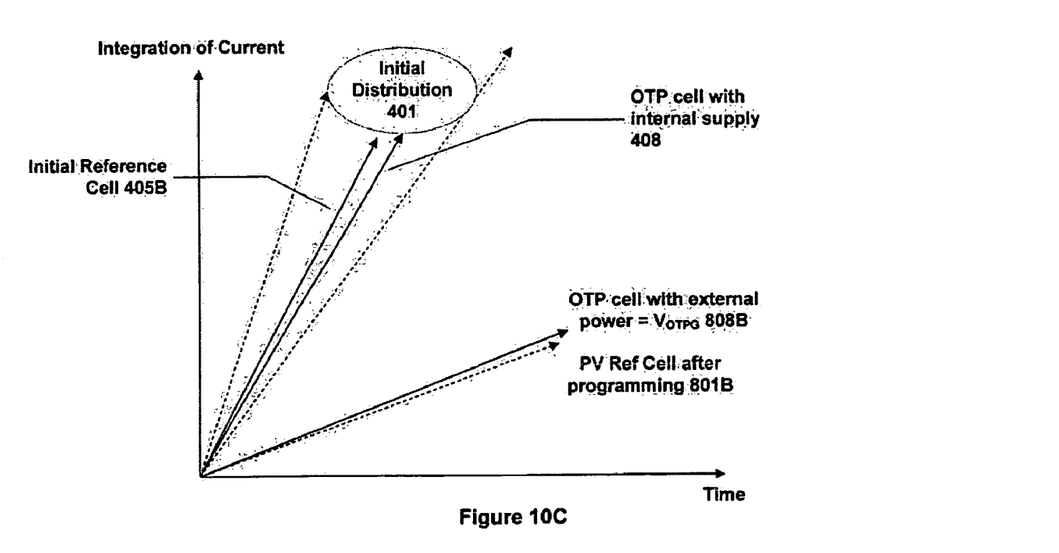

As the reference cells are programmed in this manner, they move from their initial state to a programmed state. This transition is shown in FIG. 10B for an erase-verify reference cell 361, and in FIG. 10C for a program-verify reference cell 363. Thus the reference cells start off in position 405A, 405B, as part of initial distribution 401. As they are programmed, their threshold voltage rises, and so their output current drops. Accordingly, the positions of the reference cells move downwards in FIGS. 10B, 10C, until they fall below the corresponding positions of the OTP cell 55. Thus in FIG. 10B, the erase-verify reference cell 361 is programmed until it reaches target position 801A, as detected by the position of OTP cell 808A. Likewise in FIG. 10C, the program-verify reference cell 361 is programmed until it reaches target position 801B, as detected by the position of OTP cell 808B. It will be appreciated that the OTP cell positions 808A and 808B are distinguished according to the external voltage applied to the OTP cell, which will be more or less than $V_{OTP(RD)}$ by the desired margin depending upon whether it is the erase-verify reference cell 361 or the program-verify reference cell 363 that is being programmed.

Returning to FIG. 11, once all the reference cells on all bits lines have reached their target position 801, the sense amplifiers will all output 1, and so the test at operation 920 is positive. The sector number being processed is now incremented (980), and a test performed to see if all sectors have been programmed (990). If not, processing returns to operation 910 to start programming the next sector (this may involve a reset of Vppd-level—not shown in FIG. 11). Otherwise, when all the sectors have been programmed, then processing is completed (999). (It will be appreciated that the processing of FIG. 11 is performed twice, once to program the erase-verify reference cells, and once to program the program-verify reference cells).

Note that OTP cells 55 are not programmed or erased during the above process. Consequently, they provide a stable reference point that can also be used during any subsequent testing or manufacture for checking the retention of the reference cells—i.e. that reference cells 361, 362, 363 have retained the correct setting.

In conclusion, although a variety of particular embodiments have been described in detail herein, it will be appreciated that this is by way of illustration only. The skilled person will be aware of many further potential modifications and adaptations that fall within the scope of the claims and their equivalents.

The invention claimed is:

1. A memory device comprising:
   an array of memory cells arranged into word lines and bit lines;
   a sense amplifier for each bit line; and
   a plurality of reference cells for each bit line;
   wherein the sense amplifier for a bit line compares the output of a memory cell for that bit line with the output of a reference cell for that bit line, wherein at least one of the plurality of reference cells on a bit line has a positive temperature coefficient for cell current, and at least another one of the plurality of reference cells on said bit line has a negative temperature coefficient for cell current.

2. The memory device of claim 1, wherein said plurality of reference cells comprise a read reference cell, an erase-verify reference cell, and a program-verify reference cell.

3. The memory device of claim 1, further comprising a control mechanism for selecting which of the plurality of reference cells is to be used for any given sense operation by the sense amplifier.

4. The memory device of claim 1, wherein said memory device comprises flash memory.

5. The memory device of claim 4, wherein said memory device comprises a memory device comprising a nitride charge trapping structure.

6. A memory device comprising:
   an array of memory cells arranged into word lines and bit lines;
   a sense amplifier for each bit line; and
   a plurality of reference cells for each bit line;
   wherein the sense amplifier for a bit line compares the output of a memory cell for that bit line with the output of a reference cell for that bit line, and at least one of the plurality of reference cells for each bit line comprises a one-time program cell.

7. A method for operating a memory device comprising an array of memory cells arranged into word lines and bit lines, said method comprising:

providing at least one reference cell for each bit line; and programming a reference cell on a bit line in relation to the memory cells on that bit line, wherein said programming further comprises providing a program pulse to the reference cell if it is determined that the output of at least one memory cell on the bit line does not have the desired relationship with the output of the reference cell.

8. The method of claim 7, wherein said programming comprises:

comparing the output of the reference cell with the output of each of the memory cells on the bit line; and determining whether the output of each of the memory cells on the bit line has a desired relationship with the output of the reference cell.

9. The method of claim 8, wherein said memory device further comprises a sense amplifier for each bit line, and wherein said comparing the output of the reference cell for a bit line with the output of each of the memory cells on the bit line is performed by the sense amplifier for the bit line.

10. The method of claim 7, wherein said comparing, determining and providing are repeated until the output of each of the memory cells on the bit line has the desired relationship with the output of the reference cell.

11. The method of claim 10, further comprising incrementing the level of program pulse to be provided between repetitions.

12. The method of claim 7, wherein a plurality of reference cells are provided for each bit line.

13. The method of claim 7, wherein said device comprises memory device comprising a nitride charge trapping structure.

14. A method for operating a memory device comprising an array of memory cells arranged into word lines and bit lines, said method comprising:

providing at least one reference cell for each bit line; and programming a reference cell on a bit line in relation to the memory cells on that bit line by comparing the output of the reference cell with the output of each of the memory cells on the bit line; and determining whether the output of each of the memory cells on the bit line has a desired relationship with the output of the reference cell, and wherein said comparing comprises supplying an internal voltage to the reference cell and an external voltage to the memory cells on the bit line, wherein the external voltage differs from the internal voltage by a predetermined margin.

15. The method of claim 14, wherein said reference cell comprises a read reference cell, and said predetermined margin corresponds to a cycle margin plus an erase margin.

16. A method for operating a memory device comprising an array of memory cells arranged into word lines and bit lines, said method comprising:

providing a plurality of reference cells for each bit line; and programming a reference cell on a bit line in relation to the memory cells on that bit line wherein once a first reference cell has been programmed for a bit line in relation to the memory cells on that bit line, the other reference cells on that bit line are programmed in relation to the first reference cell on that bit line.

17. The method of claim 16, wherein the other reference cells on the bit line are programmed in relation to the first reference cell on the bit line by:

providing a one-time program (OTP) cell for each bit line;

determining the value of an external voltage supply to the OTP cell to match said first reference cell; and programming the other reference cells on the bit line to match the OTP cell, subject to a predetermined margin.

18. A method for operating a memory device comprising an array of memory cells arranged into word lines and bit lines, said method comprising:

providing a program-verify reference cell and an erase-verify reference cell for each bit line;

performing a program or erase operation on said array of memory cells; and using the program-verify or erase-verify reference cell for a bit line to confirm the success of said program or erase operation in respect of the memory cells for that bit line, wherein one of the program verify reference cell and the erase verify reference cell on a bit line has a positive temperature coefficient for cell current, and the other of the program verify reference cell and the erase verify reference cell on said bit line has a negative temperature coefficient for cell current.

* * * * *